United States Patent
Sobek et al.

(10) Patent No.: US 6,236,596 B1
(45) Date of Patent: May 22, 2001

(54) BIASING METHOD AND STRUCTURE FOR REDUCING BAND-TO-BAND AND/OR AVALANCHE CURRENTS DURING THE ERASE OF FLASH MEMORY DEVICES

(75) Inventors: Daniel Sobek, Portola Valley; Timothy James Thurgate, Sunnyvale; Scott D. Luning, San Francisco; Vei-Han Chan; Sameer S. Haddad, both of San Jose, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/461,376

(22) Filed: Dec. 15, 1999

Related U.S. Application Data

(63) Continuation of application No. 08/993,570, filed on Dec. 18, 1997, now abandoned.

(51) Int. Cl.$^7$ .................................................. G11C 11/34
(52) U.S. Cl. .................................. 365/185.27; 365/185.29
(58) Field of Search ........................... 365/185.27, 185.29

(56) References Cited

U.S. PATENT DOCUMENTS

| | | | |
|---|---|---|---|
| 5,077,691 | 12/1991 | Haddad et al. | 365/218 |
| 5,561,620 | 10/1996 | Chen et al. | 365/218 |
| 5,657,271 | * 8/1997 | Mori | 365/185.27 |
| 5,790,460 | 8/1998 | Chen et al. | 365/185.29 |

FOREIGN PATENT DOCUMENTS

| | | |
|---|---|---|
| 0 597 722 A2 | 5/1994 | (EP). |
| WO 98/47151 | 10/1998 | (WO). |

OTHER PUBLICATIONS

Sameer Haddad et al., "Degradations Due To Hole Trapping in Flash Memory Cells", IEEE Electron Devices Letters, vol. 10, No. 3, pp. 117–119, Mar. 1989.

Sameer Haddad et al., "An Investigation of Erase–Mode Dependent Hole Trapping in Flash EEPROM Memory Cell", IEEE Electron Device Letters, vol. 11, No. 11, pp. 514–516, Nov. 1990.

Chi Chang et al., "Drain–Avalanche and Hole–Trapping Induced Gate Leakage in Thin–Oxide MOS Devices", IEEE Device Letters, vol. 9, No. 11,, pp. 588–590, Nov. 1988.

\* cited by examiner

*Primary Examiner*—David Nelms
*Assistant Examiner*—M. Tran

(57) ABSTRACT

A method and apparatus for reducing band-to-band currents during the erasure of a flash EEPROM memory cell is provided. The apparatus has a back biasing connection on the substrate at which a biasing voltage is applied during erasure of the flash EEPROM memory cell. The method of applying the biasing voltage to the back biasing connection during erasure of the flash EEPROM memory cell reduces band-to-band current between the source region and the substrate during erasure of the flash memory cell. This reduction provides for gate size reduction in flash memory cells without inducing detrimental short channel effects.

27 Claims, 11 Drawing Sheets

BIASING METHOD AND STRUCTURE FOR REDUCING BAND-TO-BAND AND/OR AVALANCHE CURRENTS DURING THE ERASE OF FLASH MEMORY DEVICES

This application is a continuation of application Ser. No. 08/993,570 filed Dec. 18, 1997 now abandoned.

FIELD OF THE INVENTION

The present invention relates to floating gate memory devices such as EEPROMs and more specifically to a method and apparatus for reducing band-to-band currents during the erasure of flash memory devices.

BACKGROUND OF THE INVENTION

A class of non-volatile memory devices known as "flash" EEPROMs (electrically erasable programmable read only memory devices), combines the advantages of EPROM density with the electrical erasability of an EEPROM. One feature which distinguishes flash EEPROMs from standard EEPROMs is that unlike standard EEPROMs, flash EEPROMs do not contain a select transistor on a one-for-one basis with each floating gate transistor. A select transistor provides for the selection of an individual memory cell within the memory device and can be used to selectively erase a specific memory cell. Because flash EEPROMs do not contain a select transistor on a one-for-one basis with each floating gate transistor, flash EEPROM memory cells are erased in bulk, either by erasing the entire chip or by erasing paged groups of cells. Elimination of the select transistor allows for smaller cell size and gives the flash EEPROM an advantage in terms of manufacturing yield (in terms of memory capacity) over comparably sized standard EEPROMs.

Typically, a plurality of flash EEPROM cells are formed on a single semiconductor substrate (i.e. a silicon die). FIG. 1 illustrates a single conventional flash EEPROM memory cell. As depicted in FIG. 1, flash memory cell 100 is formed on a P-type substrate 110 and includes an N-type double-diffused source region 102 and a N+ drain region 104. A substrate electrode 126 is attached to substrate 110. Drain region 104 and source region 102 are spaced apart from each other with channel region 122 interposed there between. Source electrode 114 and drain electrode 112 are respectively connected to source region 102 and drain region 104.

The double-diffused source region 102 is formed of a lightly doped N region 128 (phosphorous doped) and a more heavily doped but shallower N+ region 130 (arsenic doped), embedded within the deep N region 128. The phosphorous contained within N region 128 grades the source junction and thus reduces the horizontal electric ($E_H$) field 134 between the source region 102 and the substrate 110 in the pn junction.

The floating gate 106 is insulatively disposed a short distance above at least one of the source and/or drain regions by a dielectric layer 118. Above the floating gate 106 and insulatively disposed in the dielectric layer 116, is a control gate 108. A control gate electrode 120 is attached to control gate 108. $L_{GATE}$ 132 represents the gate length for the gates contained in flash memory cell 100.

In a conventional method of operation, the programming of a flash EEPROM memory cell is achieved by inducing "hot electron" injections from a portion of the substrate (i.e., usually a channel section near the drain region), into the floating gate. The injected electrons carry a negative charge into the floating gate and are typically induced by grounding the source region of the substrate, biasing the control gate to a relatively high positive voltage to create an electron tracking field and biasing the drain region to a positive voltage of moderate magnitude in order to generate hot (high energy) electrons.

For example, to program flash memory cell 100, source electrode 114 is tied to ground, drain electrode 112 is tied to a relatively high voltage (e.g. +4 volts to +9 volts) and the control gate electrode 120 is connected to a relatively high voltage level (e.g., +8 volts to +12 volts). Electrons are accelerated from source region 102 to drain region 104 and so-called "hot electrons" are generated near the drain region 104. Some of the hot electrons are injected through the relatively thin gate dielectric layer 118 and become trapped in the floating gate 106 thereby giving floating gate 106 a negative potential.

After sufficient negative charge accumulates on floating gate 106, the negative potential of floating gate 106 raises the threshold voltage of the stacked gate transistor and inhibits current flow through the channel 122 during a subsequent "read" mode. The magnitude of the read current is used to determine whether a memory cell has been programmed.

Conversely, to erase a flash memory device, electrons are typically driven out of the floating gate 106 by biasing the control gate 108 to a large negative voltage and the source region 102 to a low positive voltage, in order to produce a sufficiently large vertical electric field ($E_V$) in the tunnel oxide. This effect happens because the floating gate 106 reaches a large negative voltage through a capacitive coupling with the control gate 108. The sufficiently large vertical electric field ($E_V$ 136) in the tunnel oxide produces Fowler-Nordheim (F-N) tunneling of electrons stored in the floating gate 106 through the tunnel oxide and into the source region 102. The charge taken from the floating gate 106 in turn produces a threshold voltage shift ($V_T$ shift) which can be used to deprogram (erase) the device.

For example, during erasure a relatively low positive voltage (i.e. +0.5 V to +5.0 V) is applied to source electrode 114 and a relatively large negative voltage (i.e. −7 V to −13 V) is applied to control gate electrode 120. The voltage of substrate electrode 126 is grounded (0 V) and drain electrode 112 is allowed to float. The vertical electric field ($E_V$ 136) established between the control gate 108 and the source region 102 induces electrons previously stored in floating gate 106 to pass through dielectric layer 118 and into source region 102 by way of Fowler-Nordheim tunneling.

In order to produce a sufficient electric field in the tunnel oxide, it is typically necessary to bias the control gate 108 to a large enough negative voltage such that the floating gate 106 reaches a voltage of approximately −5.5 volts. A typical potential difference $V_{SF}$ between the source region 102 and floating gate 106 is on the order of 10 volts and accordingly, when the source voltage $V_S$ is made less positive, the control gate voltage $V_{CG}$ should be made more negative. Once the source to floating voltage $V_{SF}$ is selected, the remaining factors are preferably constrained according to the equation:

$$V_{FG} = \alpha_{CG}(V_{CG} - \Delta V_T) + \alpha_S V_S + \alpha_B V_B$$

where:
 $V_{FG}$=the floating gate voltage;
 $V_{CG}$=the control gate voltage;
 $V_S$=the source voltage;
 $V_B$=the substrate or p-well bias;
 $\Delta V_T$=the threshold voltage difference arising from negative charge added to the floating gate as measured from the control gate;

$\alpha_{CG}$=the capacitive coupling coefficient from the control gate to the floating gate;

$\alpha_S$=the capacitive coupling coefficient between the source and the floating gate;

$\alpha_B$=the capacitive coupling coefficient between the substrate or p-well and the floating gate.

As technology advances, a continuing goal throughout the industry is to increase the density of memory devices. By reducing the size of a flash EEPROM device a greater memory capacity can be achieved. In using more dies per wafer the cost per die can reduced. In addition, using higher density memory devices may provide for a reduction in the over all power consumption.

In order to increase the memory density of flash EEPROM devices, the memory cells are typically scaled down in size (e.g. reduction in overall footprint of the device) by reducing the gate length ($L_{GATE}$ 132) and gate width ($W_{GATE}$ 138). However, a problem with reducing the length of the memory cell gates is that the distance between the source region 102 and the drain region 104 is also reduced. As the source region 102 approaches the drain region 104 the lateral diffusion from the phosphorous in the source region (N region 128) causes a leakage between the source region 102 and the drain region 104 resulting in detrimental short channel effects. Short channel effects produce serious problems in the flash memory cells and are typically evident when the gate length ($L_{GATE}$ 132) is reduced below 0.4 microns.

One method for reducing the short-channel effect is by eliminating the N double-diffused phosphorous region. By using a single-diffused source region, the phosphorous diffusion overlap distance $L_{DD}$ 124 is no longer present and the short channel effect problem is significantly reduced. Eliminating the phosphorous diffusion overlap distance $L_{DD}$ 124 allows for a gate length ($L_{GATE}$ 132) reduction below 0.4 microns and therefore provides for an increased packing density of the memory cells.

However, eliminating the phosphorous doped N region 128 produces an unwanted side-effect of increasing the horizontal electric ($E_H$) field 134 between the source region 102 and the substrate 110 in the pn junction during erasure of the memory cell. This increase in the horizontal electric ($E_H$) field 134 directly contributes to an increase in the band-to-band current since it is generally accepted that:

$$J_{b\text{-}t\text{-}b} = A_{b\text{-}t\text{-}b} f(E) e^{-(B_{b\text{-}t\text{-}b}/E)}$$

where:

$J_{b\text{-}t\text{-}b}$=band-to-band current density [A/cm²]

$A_{b\text{-}t\text{-}b}$, $B_{b\text{-}t\text{-}b}$=constants f(E) sometimes modeled as $E^2$ E=SQRT ($E_V^2 + E_H^2$) (the tunneling field in the junction).

Because of the source-to-substrate biasing during the erasure of the memory cell device, a reversed-biased pn junction is formed which produces band-to-band currents (also known as Zener currents) in the source junction. The band-to-band currents are normally several orders of magnitude larger than the Fowler-Nordheim current. This band-to-band current is hard to sustain from a circuit design point of view and is also believed to generate detrimental reliability problems such as hole trapping in the tunnel oxide.

Hole trapping can potentially affect the floating gate's ability to retain a negative charge (electrons), as the trapped holes have a tendency to migrate to the floating gate 106 and to neutralize the negative charge therein. The production of holes at the surface of the dielectric 118 below the floating gate 106 is undesirable as it can interfere with reliable programming, reading and erasure of randomly located memory cells, known as the gate disturb phenomenon. This gate disturb phenomenon occurs because holes trapped in the tunnel oxide layer tend to migrate upwardly into the floating gate 106 to neutralize negative program charges and thus decrease the charge retention time of the floating gate 106.

More specifically, during erasure some memory cells may produce more hot holes than others and, consequently, some floating gates will be discharged faster than others. This creates a non-uniform erasure throughout the memory chip. Holes that do not migrate to the floating gate 106 during erasure can remain in the dielectric 118 for random periods of time. These holes can later migrate into the floating gate 106 after the memory cell has been programmed and neutralize part of the programming charge that is to be retained.

In addition to the detrimental hole trapping, the band-to-band currents require additional current from the memory chip charge pumps. Because the movement in the industry has generally been to reduce the supply voltage for memory chips, the charge pump efficiency has also been reduced and therefore cannot support the band-to-band currents. Under this condition, the source bias is decreased thus reducing the cell erase speed.

Therefore, it is highly desirable to devise a method for reducing band-to-band currents in flash memory cells while still providing for gate size reduction without inducing detrimental short channel effects.

SUMMARY OF THE INVENTION

There is a need for a memory device and method of erasing the memory device with reduced band-to-band currents to provide for a gate size reduction in the flash memory cells without inducing detrimental short channel effects.

These and other needs are satisfied by the present invention which provides a method and apparatus for reducing band-to-band currents during the erasure of a flash memory device. According to one aspect of the invention, the apparatus includes a flash EEPROM memory cell that has a semiconductor substrate having a source region in the substrate at which a source voltage is applied during erasure of the flash EEPROM memory cell. The semiconductor substrate also has a drain region and an oxide layer on top of the substrate. A floating gate in the oxide layer is disposed above at least a portion of the source region and a control gate also in the oxide layer is disposed above the floating gate at which a control voltage is applied during erasure of the flash EEPROM memory cell. A back biasing connection is coupled to the substrate at which a biasing voltage is applied during erasure of the flash EEPROM memory cell.

The back biasing voltage reduces band-to-band current between the source region and the substrate during erasure of the flash memory cell. The reduction in band-to-band currents provides for a gate size reduction in the flash memory cell without inducing detrimental short channel effects.

According to another aspect of the invention, the apparatus includes a well that is located in the substrate and encloses both the source and drain regions. The back biasing connection is coupled to the first well. One of the advantages of this embodiment is reducing the band-to-band current between the source region and the substrate during erasure of the flash memory cell.

According to another aspect of the invention, the apparatus includes a substrate biasing connection on the substrate at which a second biasing voltage is applied during erasure of the flash EEPROM memory cell. The substrate biasing connection is coupled to a second well which encloses the first well. This structure reduces current flow into the substrate during erasure of the flash memory cell.

According to another aspect of the invention, a modulator is associated with the back biasing connection in order to modulate the back biasing voltage during memory cell erasure.

According to yet another aspect of the invention, the back biasing connection is coupled to the substrate biasing connection to cause the second well to be reversed biased relative to the first well during memory cell erasure.

According to still another aspect of the invention, a method for reducing band-to-band current between a source region and a substrate during erasure of a flash EEPROM memory cell is provided. Band-to-band current is reduced during erasure of the flash EEPROM memory cell by applying a source voltage to the source region, applying a control voltage to a control gate, where the difference between the control voltage and the source voltage is sufficient to erase the flash EEPROM memory cell, and applying a back bias voltage to the substrate which is sufficiently large to reduce band-to-band current between the source and the substrate.

The foregoing and other features, aspects and advantages of the present invention will become more apparent from the following detailed description of the present invention when taken in conjunction with the accompanying drawings.

DETAILED DESCRIPTION OF ILLUSTRATIVE EMBODIMENTS

The following detailed description is of the best modes presently contemplated by the inventors for practicing the invention. It should be understood that the descriptions of these preferred embodiments are merely illustrative and that they should not be taken in a limiting In the present invention, a back bias is utilized to reduce the voltage difference across the source pn junction (source-substrate junction) by applying a low positive voltage to the substrate portion of the flash memory cell. This back bias has the effect of reducing the voltage difference between the source and the substrate and results in a lateral field reduction at the source pn junction. Reducing the lateral field at the source pn junction lowers the band-to-band currents and therefore eliminates the need for a double diffused source region during memory cell erasure. In certain embodiments of the invention, the overall width of the N region is reduced while still maintaining a double-diffused source junction. By using single diffused source regions, in place of the previous double diffused source regions, a reduction in gate length can be achieved thus providing for an increased packing density of memory cells.

Figure 1:
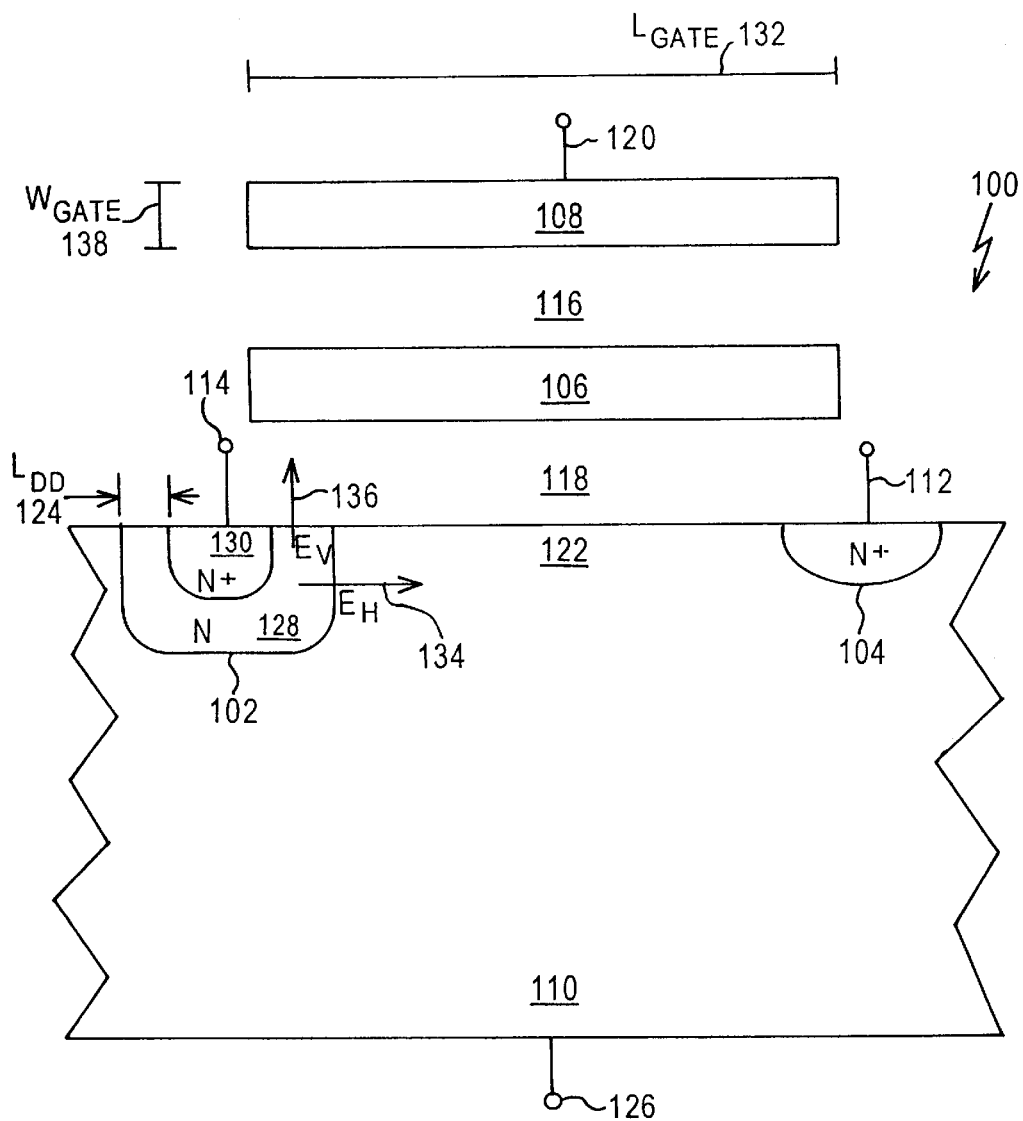
FIG. 1 depicts a conventional flash EEPROM memory cell.
Figure 2:
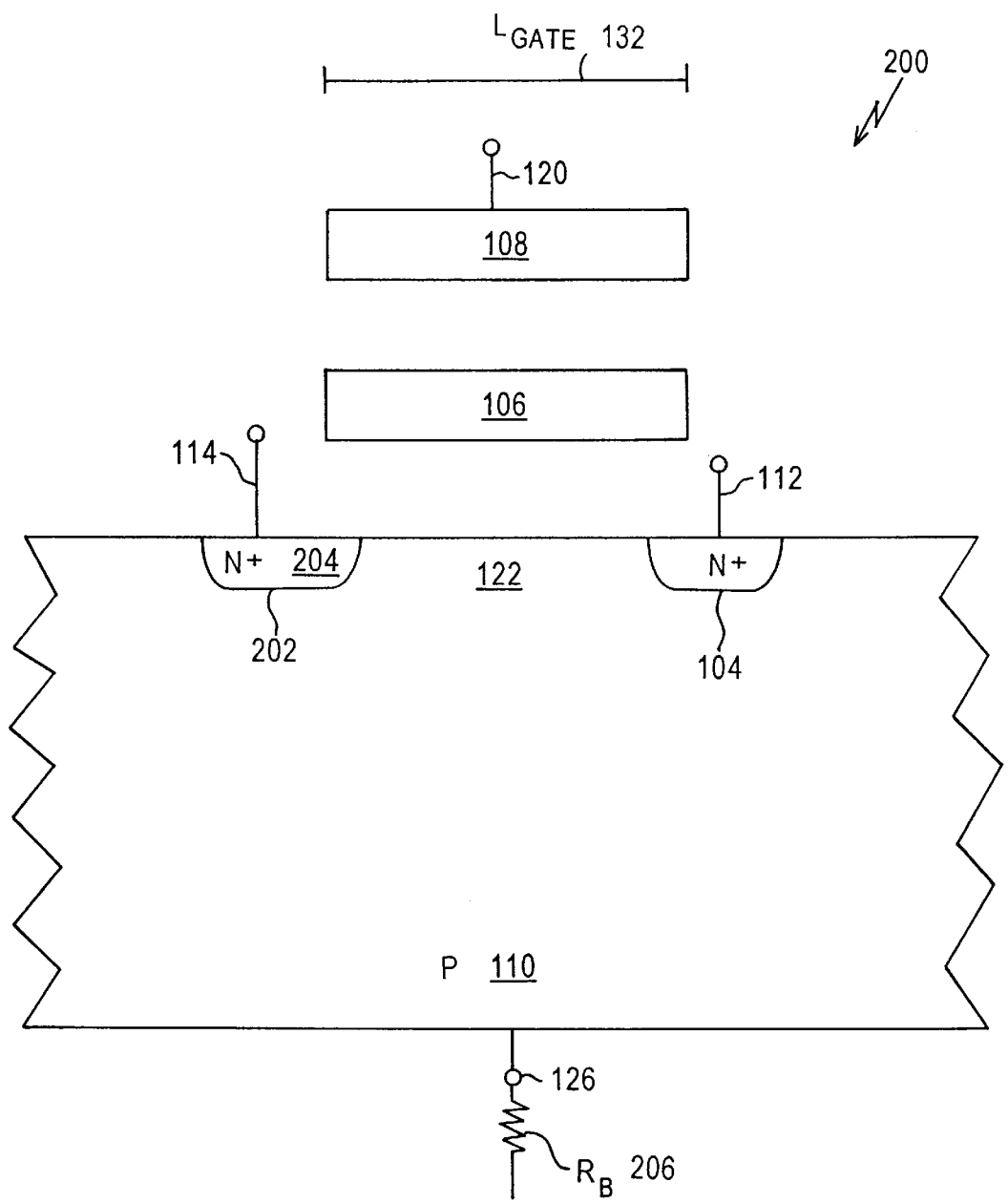
FIG. 2 depicts a first embodiment of a flash EEPROM memory cell according to the present invention in which in band-to-band currents are reduced during the erasure of a flash memory cell.

FIG. 2 illustrates one embodiment of the present invention in which a back bias is utilized for reducing band-to-band currents during the erasure of a flash memory cell. As many of the components in FIG. 2 are similar to FIG. 1, like components are numbered alike.

As depicted in FIG. 2, a single diffused source 202 comprising N+ region 204, is used to promote $L_{GATE}$ 132 reduction without inducing short channel effects in the memory cell 200. According to the present invention, a relatively low positive voltage is applied to substrate electrode 126 during the erasure of memory cell 200. A back bias is thereby provided which reduces the voltage difference between source region 202 and substrate 110. This reduction decreases the lateral field at the pn junction and therefore reduces band-to-band currents during erasure of the memory cell. By reducing the band-to-band currents in the pn junction hole trapping can be minimized. In certain embodiments of the invention, a modulator is used to modulate the substrate voltage during memory cell erasure. In one embodiment, the modulator is a resistor. For example, as shown in FIG. 2, a resistor $R_B$ 206 is associated with the substrate electrode 126 and is used to modulate the substrate voltage during memory cell erasure.

It should be noted that although FIG. 2 depicts a single diffused source region, in certain embodiments of the invention a double-diffused source region is employed with a reduced N-region width (e.g. reduced amount of phosphorous).

Figure 3:
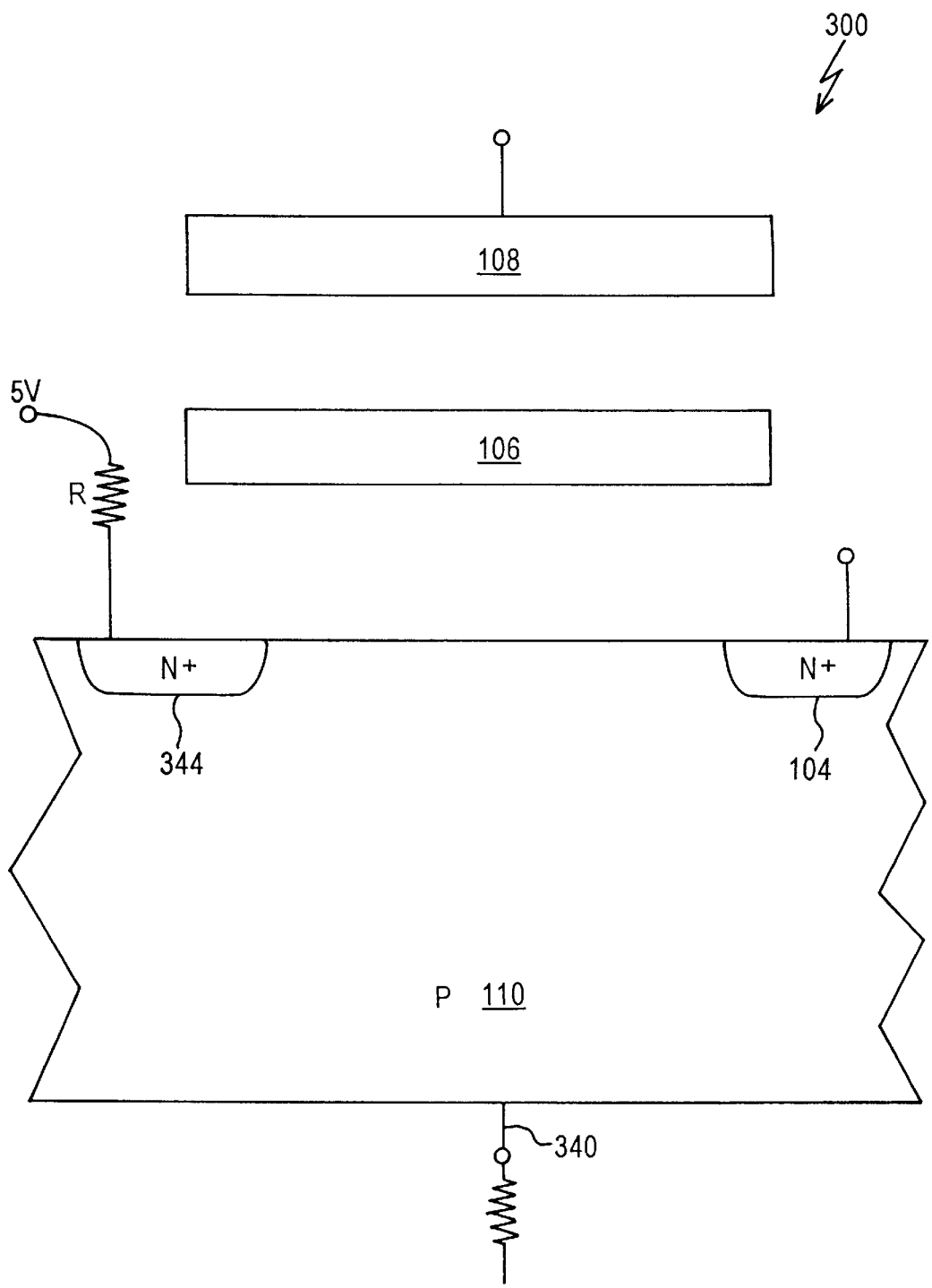
FIG. 3 illustrates a test setup used to test the erase time and the amount of band-to-band current produced during the erasure of a memory cell employing one embodiment of the invention.

FIG. 3 illustrates a test setup for comparing the erase time and the amount of band-to-band current produced during the erasure of two different types of memory cells. A conventional memory cell contains a source region comprising a greater amount of phosphorus and no back bias. The memory cell of the present invention includes a source region with a reduced amount of phosphorus and a back bias (e.g. 2.5 volts) applied to the substrate. As depicted in FIG. 3, a resistor load R is connected to the source region 344 and modulates the source voltage during memory cell erasure.

Figure 4:
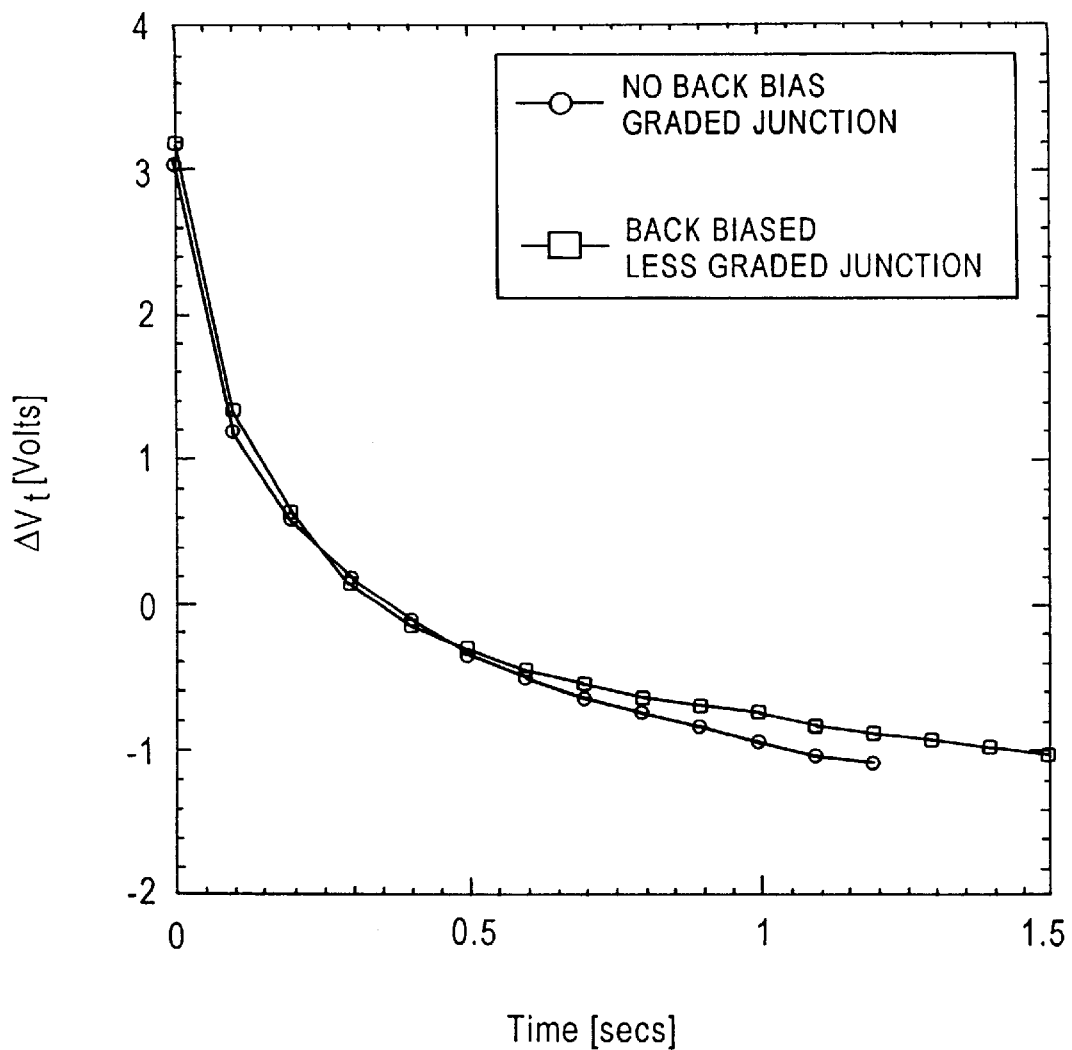
FIG. 4 is a graphical comparison between exemplary erase times of a conventional memory cell and a memory cell employing an embodiment of the present invention.

By measuring the change in saturation threshold voltage ($V_{TSAT}$) as a function of time during erasure, the erase time of both the conventional cell and the cell of the present invention can be determined. FIG. 4 is a graphical representation of exemplary erase times of the conventional (in circles) and the inventive (in squares) memory cells. As depicted in FIG. 4, the data curves produced by both memory cells are analogous. This demonstrates that the addition of a back bias to the substrate according to embodiments of the invention does not significantly affect the erase time of a flash memory cell.

Figure 5:
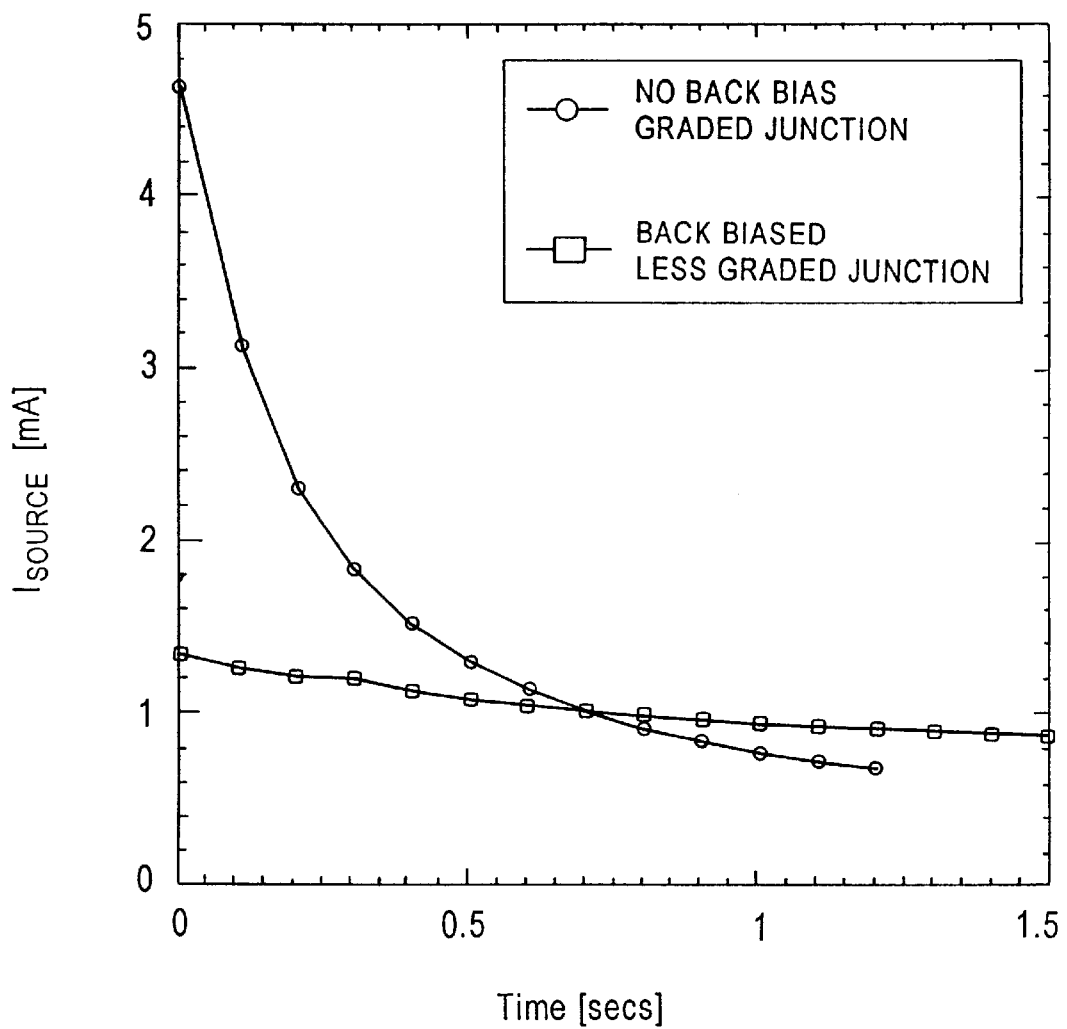
FIG. 5 is a exemplary graphical comparison between the amount of source current required for erasing a memory cell employing an embodiment of the invention and a memory cell of conventional type.

FIG. 5 is a graph depicting the amount of source current respectively required for erasing the conventional (in circles) and inventive (in squares) memory cells. The amount of current required to erase the memory cell of the present invention (indicated by squares) is significantly reduced as compared to the conventional technology. This reduced current requirement denotes a reduction in band-to-band current during erasure of flash memory cells employing an embodiment of the invention over those cells without the present invention.

Figure 6:
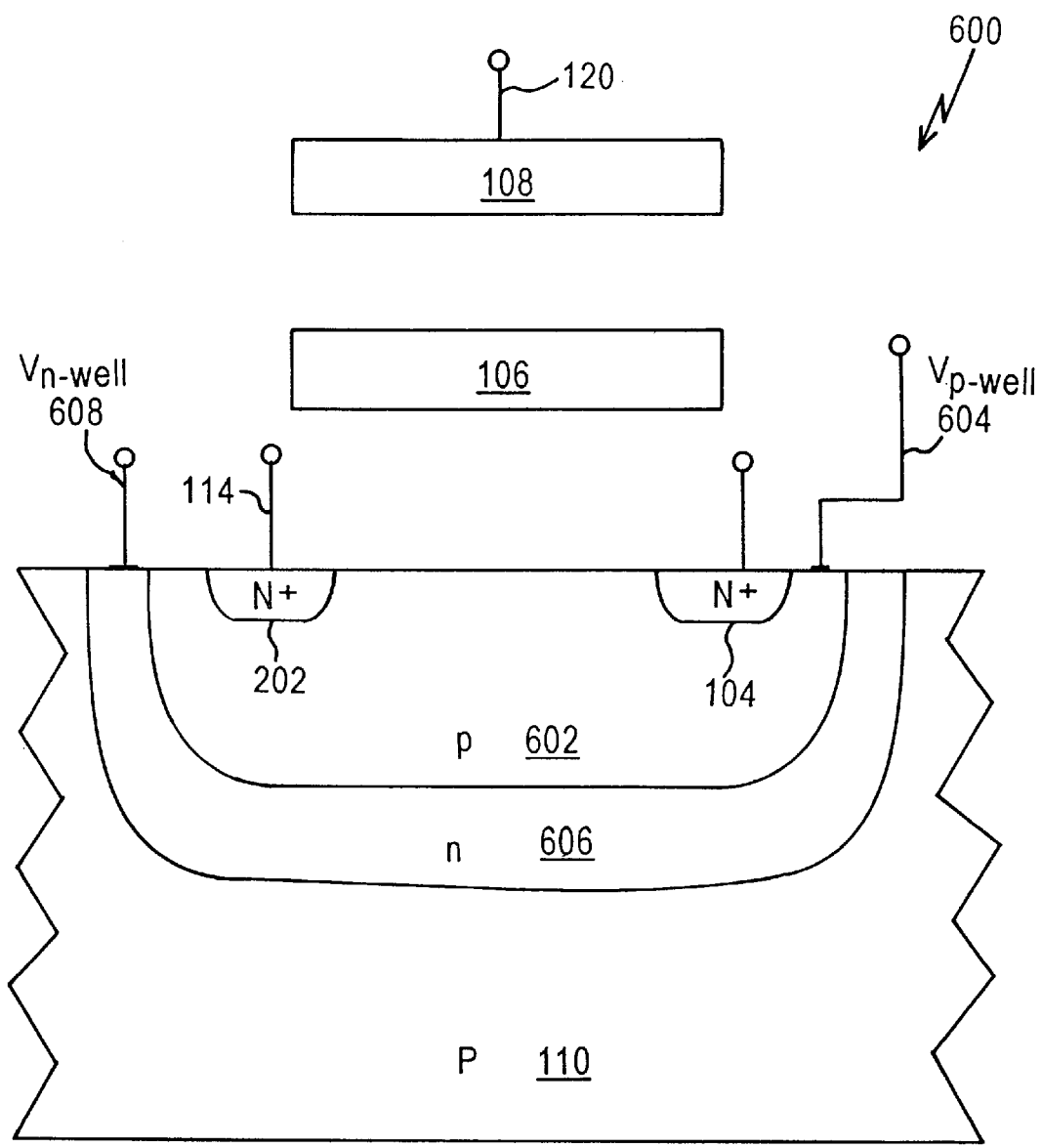
FIG. 6 depicts another embodiment of the present invention.

FIG. 6 depicts another embodiment of the present invention in which a p-well and an n-well are used to reduce band-to-band currents during the erasure of a memory cell. FIG. 6 is similar to FIG. 2 and like components are numbered alike.

As depicted in FIG. 6, a p-well 602 is located in substrate 110 and encloses both single diffused source region 202 and drain region 104. Although FIG. 6 depicts an abrupt N+ source region 202, a double diffused source region with a reduced amount of phosphorous can also be used to promote $L_{GATE}$ reduction without inducing prohibitively large short channel effects. By applying a relatively low positive voltage to $V_P$-well 604 during memory cell erasure, a p-well back bias is used to reduce the voltage difference across the source pn junction (source—p-well junction). This voltage difference reduction decreases the lateral field at the source pn junction and therefore reduces band-to-band currents during erasure of the memory cell.

As depicted in FIG. 6, an n-well 606 is also associated with substrate 110. The n-well 606 encloses p-well 602 and is used to reduce current flow into the substrate 110, caused by the p-well back bias. By applying a negative voltage to $V_N$-well 608 during memory cell erasure, which is approximately 0.5 volts higher than the voltage applied to $V_P$-well 604, n-well 606 reduces current flow into the substrate 110.

Figure 7:
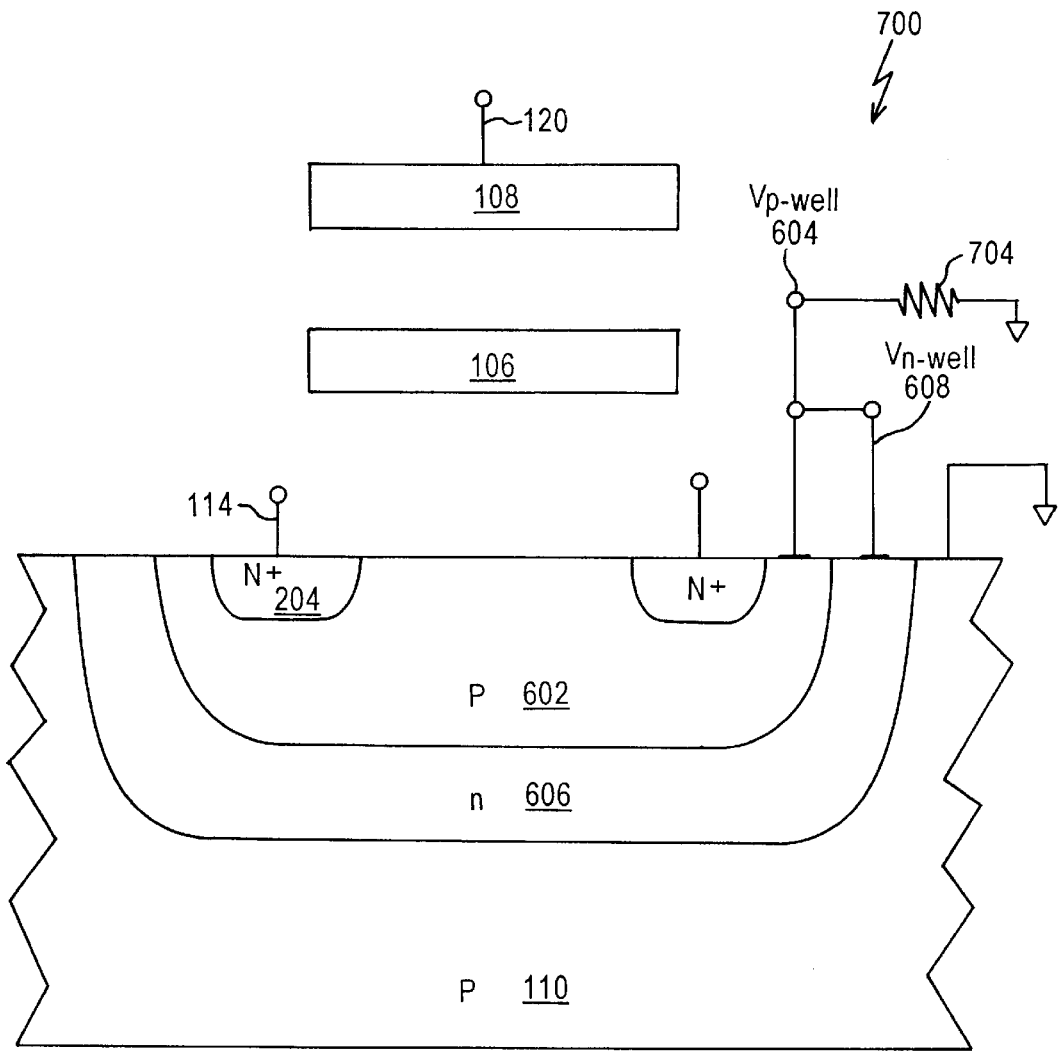
FIG. 7 depicts still another embodiment of the present invention.

In certain embodiments of the present invention, a modulator is connected in series with the p-well connection to cause the back bias to be applied proportionally to the substrate (band-to-band) current. In one embodiment, the modulator is a resistor. For example, as depicted in FIG. 7, a resistor $R_P$ 704 is associated with $V_P$-well 604 and is used to modulate the p-well 602 voltage during memory cell erasure. Additionally, as depicted in FIG. 7, in certain embodiments of the invention, the $V_P$-well 604 and $V_N$-well 608 are connected to ensure that the n-well 606 is always reversed biased relative to the p-well 602.

To demonstrate the reduction of band-to-band current in memory cells employing an embodiment of the present invention, the inventors performed tests on an array of stacked gate devices. The array like structure has a direct connection to the floating gate. The following experimental conditions were used:

the floating gate voltage was set to a constant −5.0 volts (e.g. no longer "floating");
the source voltage was ramped from 0 to 5.0 volts;
the drain was left floating; and
the substrate back bias was increased from 0 to 2 volts in increments of 0.5 volts.

Figure 8:
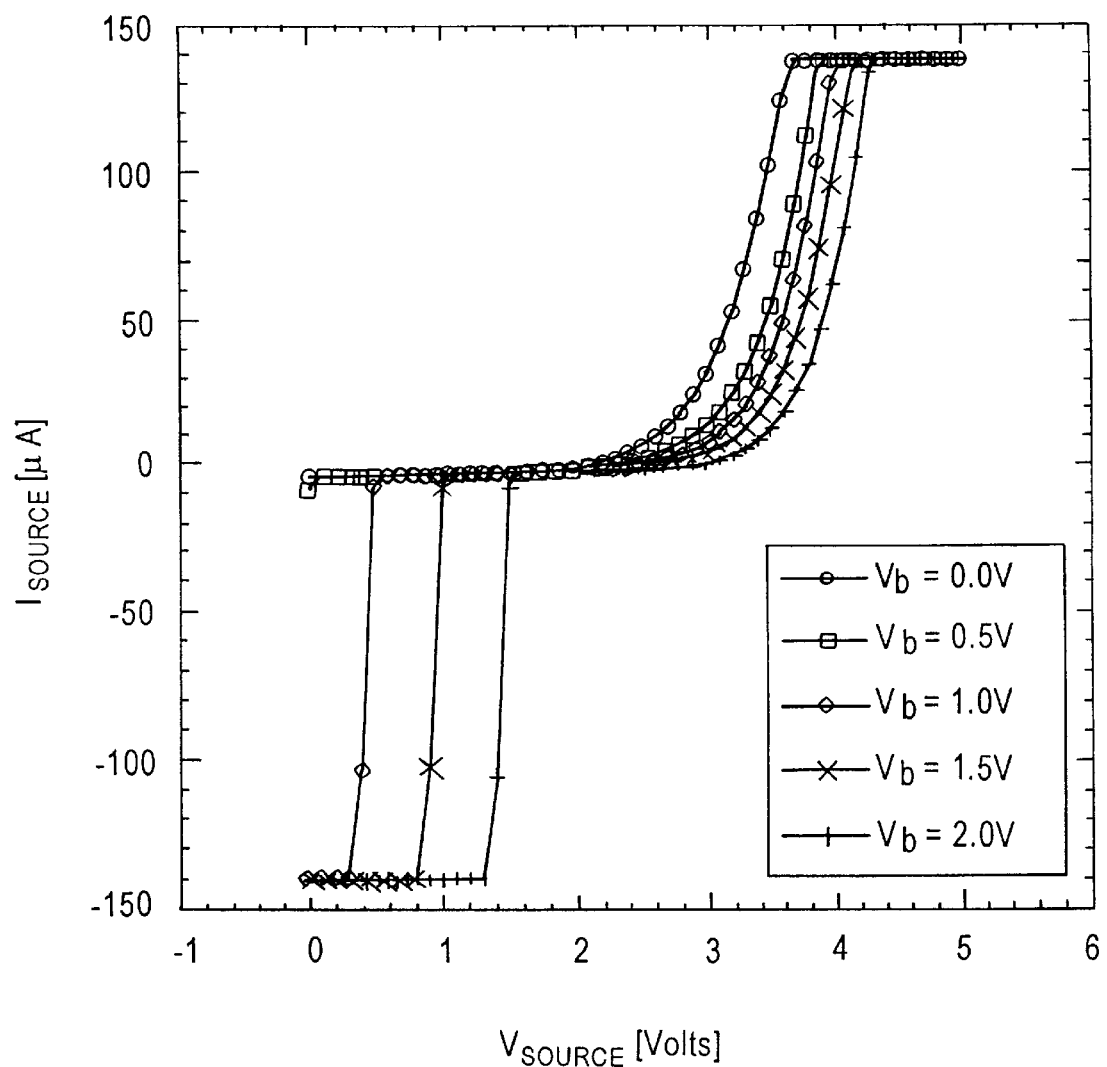
FIG. 8 is a graph of source current plotted against source voltage for different substrate or back biasing voltages.
Figure 9:
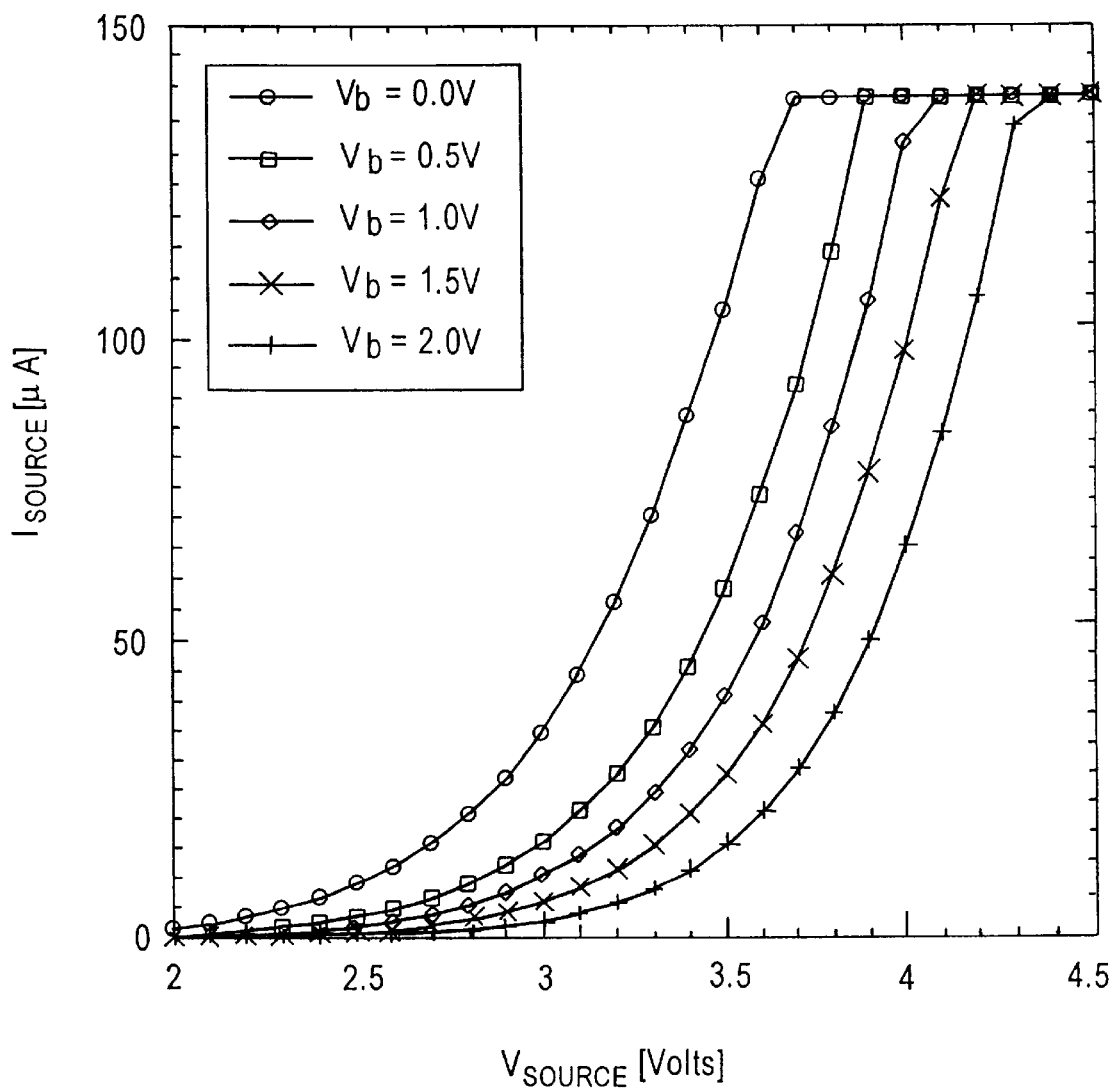
FIG. 9 is a graph of the source current as a function of the source voltage for multiple substrate bias values for an embodiment of the invention.
Figure 10:
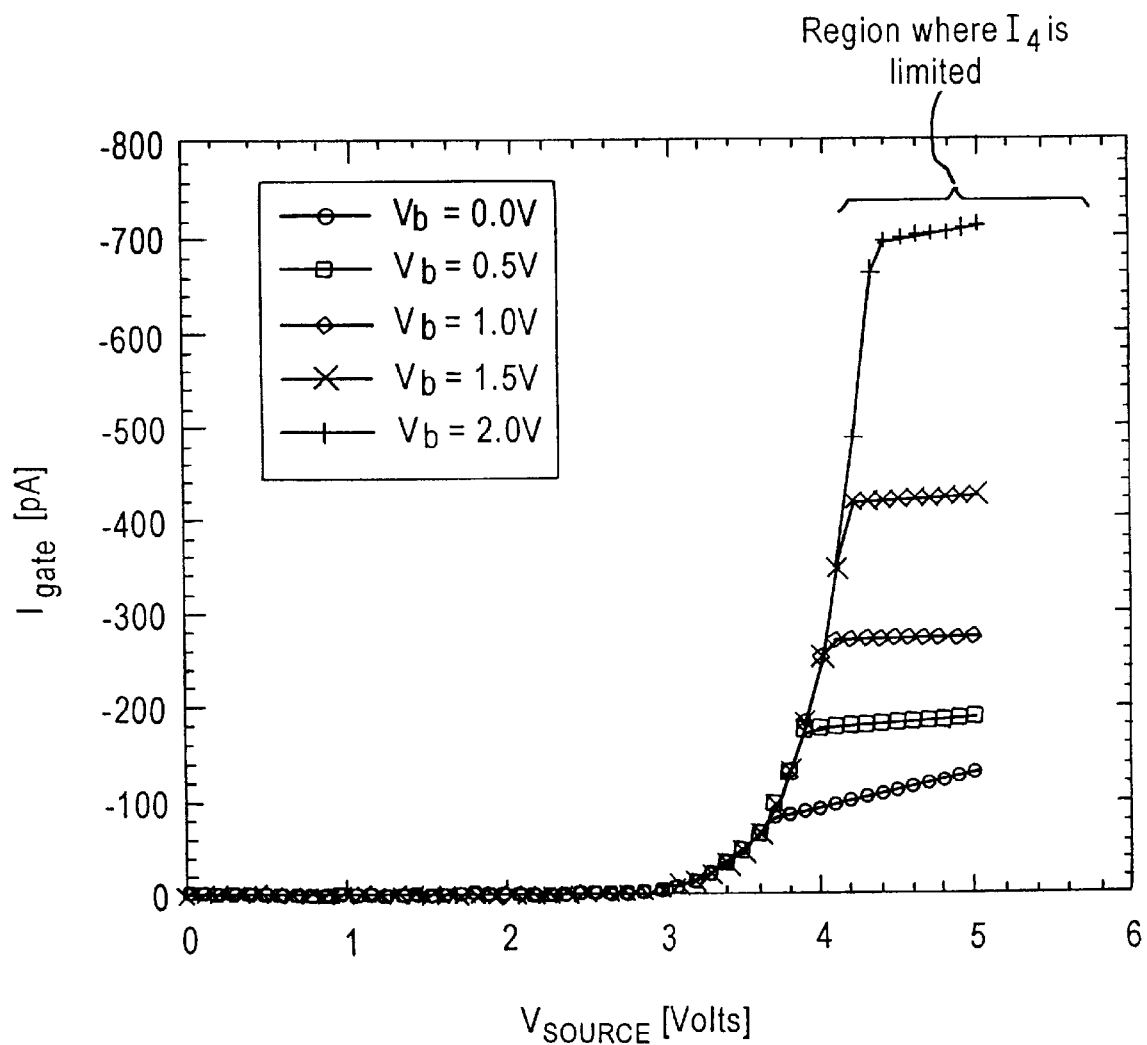
FIG. 10 is a graph of the gate current plotted against source voltage for an embodiment of the present invention.

The results of these experiments are depicted graphically in FIGS. 8–10. The experiments demonstrated that band-to-band current (measured as the source current) is significantly reduced when a substrate of a flash memory cell is back biased in 0.5 volt increments. The floating gate current was monitored and is representative of the amount of Fowler-Nordheim current which was present during erasure of the memory device. The experiments show that back biasing the substrate during erasure of the memory device does not reduce the Fowler-Nordheim current.

Because the source-substrate junction is a pn junction, it is similar to a diode. Therefore, as long as the source voltage is maintained at a greater positive voltage than the substrate, the pn junction remains in a reverse biased state. However, if the substrate voltage becomes greater than the source voltage by a certain amount greater than the built-in potential (e.g. 0.5 V), the source pn junction becomes forward biased.

FIG. 8 graphically illustrates that for substrate bias $V_B$ values, where $V_B$=1, 1.5 and 2.0 volts, the source junction diode is forward biased, resulting in a significant negative source current. Therefore, in certain embodiment of the present invention, the forward biasing effect is prevented by using a substrate bias $V_B$ value of about 0.5 volts since no significant forward bias current is observed when substrate bias $V_B$ is equal to 0.5 volts or below. In an alternative embodiment, to avoid the forward biasing effect, the source region is biased to the erase voltage before or at the same time that the substrate bias $V_B$ is applied. For example, a voltage divider can be built using a resistor attached to the body of the substrate that maintains the substrate voltage at a level proportional to the source voltage.

FIG. 9 graphically illustrates the source current $I_S$ as a function of the source voltage $V_S$ for multiple substrate back bias $V_B$ values. As depicted in the embodiment of FIG. 7, source current $I_S$ is reduced by biasing the substrate of the memory cell at different voltage levels. The reduction in source current $I_S$ indicates that less band-to-band current is present in the source junction as substrate bias $V_B$ is increased. The maximum current in the experiment was limited or clipped to a maximum value in order to prevent tunnel oxide degradation. It is expected that an even larger reduction in band-to-band current can be obtained at a source voltage of approximately 4.5 volts as provided in certain embodiments of the invention.

For example, as depicted FIG. 9, when source voltage $V_S$ is set to +3.6 V, the source current $I_S$ is dependent on the substrate bias $V_B$ voltage level as follows:

| $V_B$ [volts] | $I_S$ [μA] |
|---|---|
| 0.0 | 124.70 |
| 0.5 | 71.291 |
| 1.0 | 50.474 |
| 1.5 | 33.859 |
| 2.0 | 19.034 |

The reduction in source current $I_S$ as the level of the substrate bias voltage $V_B$ is increased from 0.0 volts to 2.0 volts, correlates to a reduction in band-to-band current during erasure of the memory cell.

FIG. 10 is a graph depicting the effect on the Fowler-Nordheim current (erase speed) for different substrate biasing $V_B$ values as the source voltage is increased. FIG. 10 demonstrates that the substrate bias value $V_B$ does not affect the gate current (i.e., erase Fowler-Nordheim current) in the region where the source current is not limited. The substrate bias approach of the present invention can be of benefit when the source current $I_s$ needs to be limited, since increasing the back bias voltage does not result in higher gate current magnitudes, as seen in FIG. 10.

By applying a back biasing voltage to the substrate, positive voltage from the substrate is coupled into the floating gate. The coupling has been determined to influence the floating gate voltage level at a ratio of approximately 25%. This coupling can affect the floating gate voltage level and the erase characteristics of the memory cell.

Therefore, to compensate for the positive voltage that is coupled into the floating gate, in certain embodiments of the present invention, the control gate voltage and/or the source voltage is adjusted such that the erase time remains constant.

Figure 11:
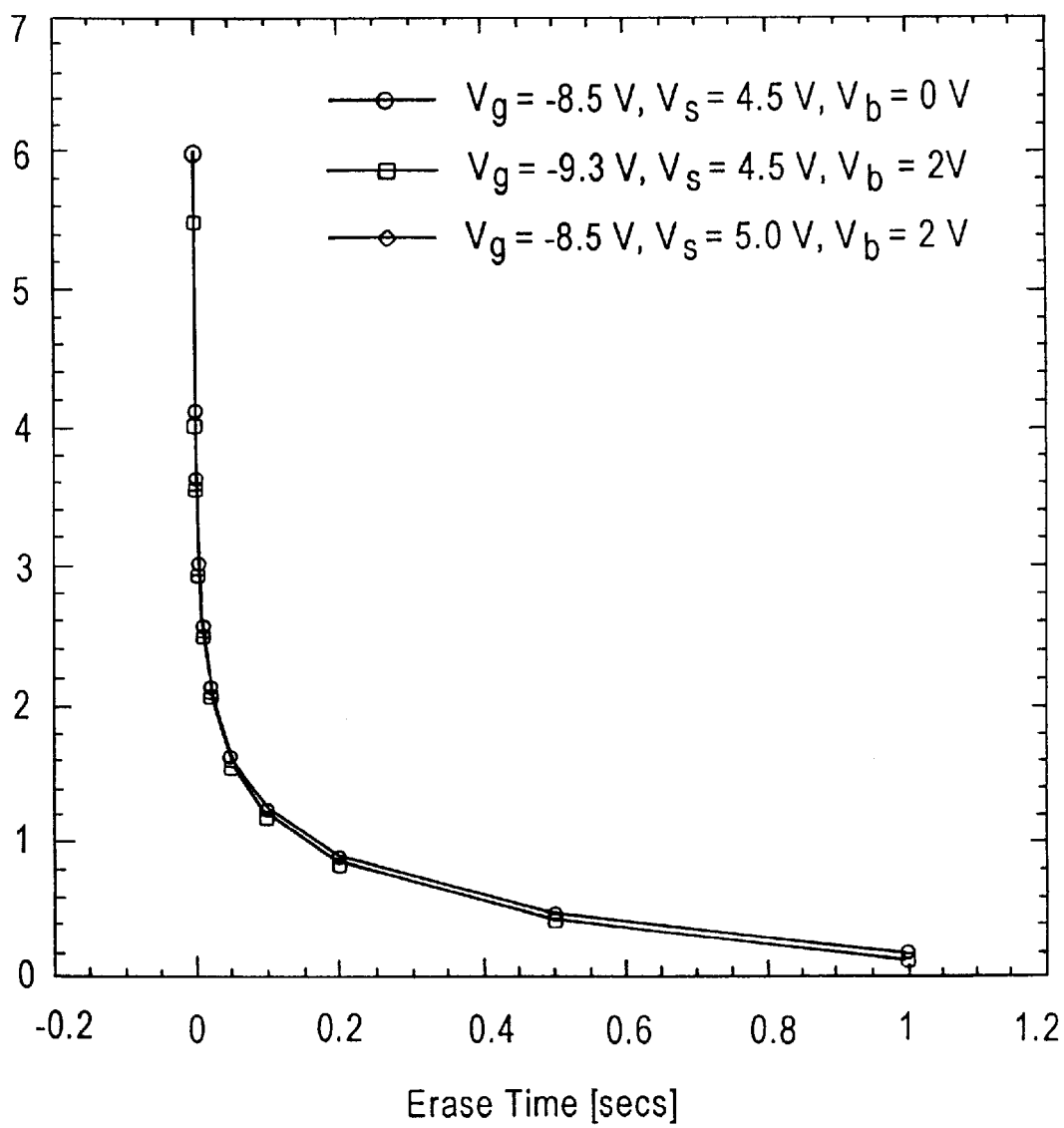
FIG. 11 is a graph of the saturation threshold voltage plotted against the erase times for different applied voltage combinations.

For example, FIG. 11 depicts a graph illustrating the erase characteristics of a memory cell employing different back biasing schemes. As shown in FIG. 12, the source voltage $V_s$ and gate voltage $V_g$ can be adjusted such that when the substrate back bias voltage $V_b$ is applied, the erase time remains constant. The control case corresponds to the following biasing conditions:

$V_g$ (control gate bias)–8.5 V $V_s$ (source bias)=4.5 V $V_b$ (substrate bias)=0 V.

The graph demonstrates that for a substrate back bias $V_b$ of 2.0 volt, the erase speed of a flash memory cell can be retained by either increasing the source bias $V_s$ by 0.5 volts or by decreasing the control gate bias $V_g$ by +0.8 volts (to −9.3 volts.).

The above-described embodiments are merely illustrative of the invention. Various alternate designs will become apparent to those skilled in the art after reading the above disclosure. For example, the invention may be applied to so called split gate transistors wherein an erasure is carried out through the drain rather than through the source region.

In addition, although the above-described embodiments have depicted N-type source and drain regions embedded in a P-type substrate, the present invention may also be used in memory cells comprising an N-type substrate. In this situation, the polarization of the present invention embodiments can be reversed in order to reduce band-to-band currents during erasure of memory cells employing N-type substrates.

In the foregoing specification, the invention has been described with reference to specific embodiments thereof. It will, however, be evident that various modifications and changes may be made thereto without departing from the broader spirit and scope of the invention. The specification and drawings are, accordingly, to be regarded in an illustrative rather than a restrictive sense.

What is claimed is:

1. A flash EEPROM memory cell comprising:

a substrate;

a source region in the substrate at which a source voltage is applied during erasure of the flash EEPROM memory cell;

a drain region in the substrate;

a first oxide layer on the substrate;

a floating gate on said first oxide layer, wherein said floating gate is disposed above at least a portion of the source region;

a control gate on a second oxide layer, wherein said control gate is disposed above the floating gate, and wherein a control voltage is applied to said control gate during erasure of the flash EEPROM memory cell; and a back biasing connection on the substrate at which a non-zero first biasing voltage is applied during erasure of the flash EEPROM memory cell, wherein the biasing voltage is applied in proportion to the band-to-band current that is present during erasure of the flash EEPROM memory cell and wherein the first biasing voltage is greater than 0 volts and less than or equal to 0.5 volts during erasure of the flash EEPROM memory cell.

2. The flash EEPROM memory cell of claim 1, wherein the difference in the source voltage and the control voltage is sufficiently large to induce electron tunneling from the floating gate to the source region during flash erasure.

3. A flash EEPROM memory cell comprising:

a substrate;

a source region in the substrate at which a source voltage is applied during erasure of the flash EEPROM memory cell and the source voltage is in the range of 0 V to 10 V;

a drain region in the substrate;

a first oxide layer on the substrate;

a floating gate on said first oxide layer, wherein said floating gate is disposed above at least a portion of the source region;

a control gate on a second oxide layer, wherein said control gate is disposed above the floating gate, and wherein a control voltage is applied to said control gate during erasure of the flash EEPROM memory cell and the control voltage is in the range of 0 V to −20 V;

a back biasing connection on the substrate at which a non-zero first biasing voltage is applied during erasure of the flash EEPROM memory cell, wherein the first biasing voltage is applied in proportion to the band-to-band current that is present during erasure of the flash EEPROM memory cell and the first biasing voltage is between 0 V and 10 V;

a first well located in the substrate and enclosing the source region and the drain region, wherein the back biasing connection is coupled to the first well;

a substrate biasing connection on the substrate at which a second biasing voltage is applied during erasure of the flash EEPROM memory cell and the second biasing voltage is between 0 V and −10 V; and a second well located in the substrate and enclosing the first well, wherein the substrate biasing connection is coupled to the second well for reducing current flow into the substrate during erasure of the flash EEPROM memory cell.

4. The flash EEPROM memory cell of claim 3, wherein:

the substrate is a p-substrate;

the first well is a p-well; and the second well is a n-well.

5. The flash EEPROM memory cell of claim 3, further comprising a modulator associated with the back biasing connection, wherein the modulator is used to modulate the first biasing voltage during memory cell erasure.

6. The flash EEPROM memory cell of claim 5, wherein the modulator used to modulate the first biasing voltage during memory cell erasure is a resistor.

7. The flash EEPROM memory cell of claim 5, wherein the back biasing connection is coupled to the substrate biasing connection, wherein coupling the back biasing connection to the substrate biasing connection causes the second well to be reversed biased relative to the substrate during memory cell erasure.

8. A flash EEPROM memory cell comprising:

a substrate;

a source region in the substrate at which a source voltage is applied during erasure of the flash EEPROM memory cell;

a drain region in the substrate;
a first oxide layer on the substrate;
a floating sate on said first oxide layer, wherein said floating gate is disposed above at least a portion of the source region;
a control gate on a second oxide layer, wherein said control gate is disposed above the floating gate, and wherein a control voltage is applied to said control gate during erasure of the flash EEPROM memory cell;
a back biasing connection on the substrate at which a non-zero first biasing voltage is applied during erasure of the flash EEPROM memory cell, wherein the biasing voltage is applied in proportion to the band-to-band current that is present during erasure of the flash EEPROM memory cell; and
a modulator associated with the back biasing connection, wherein the modulator is used to modulate the first biasing voltage during memory cell erasure and wherein the modulator used to modulate the first biasing voltage during memory cell erasure is a resistor.

9. A method of erasing a flash EEPROM memory cell having a source region, a drain region, a substrate, and a control gate, wherein the method comprising the steps of:
applying a source voltage to the source region;
applying a control voltage to the control gate, the difference between the control voltage and the source voltage being sufficient to erase the flash EEPROM memory cell;
applying a first well voltage to a first well, wherein the first well is located in the substrate and encloses the source region and the drain region, and wherein the step of applying the first well voltage includes the step of applying the first well voltage in a range that is greater than 0 volts and less than or equal to 0.5 volts during erasure of the flash EEPROM memory cell;
applying a second well voltage to a second well, wherein the second well is located in the substrate and encloses the first well; and
wherein a modulator is used to modulate the first well voltage during memory cell erasure.

10. The method of claim 9, wherein:
the step of applying a second well voltage to the second well includes the step of applying a second well voltage that is sufficiently large to reduce current flow between the first well and the substrate.

11. The method of claim 9, further comprising the step of applying the source voltage simultaneously or prior to the application of the first well voltage.

12. The method of claim 9, wherein the modulator is used to modulate the second well voltage during memory cell erasure.

13. A method of erasing a flash EEPROM memory cell having a source region, a drain region, a substrate, and a control gate, wherein the method comprising the steps of:
applying a source voltage to the source region;
applying a control voltage to the control gate, the difference between the control voltage and the source voltage being sufficient to erase the flash EEPROM memory cell;
applying a first well voltage to a first well, simultaneously or prior to the application of the substrate biasing voltage during memory cell erasure, wherein the first well is located in the substrate and encloses the source region and the drain region and a modulator is used to modulate the first well voltage during memory cell erasure; and
applying a second well voltage to a second well, wherein the second well is located in the substrate and encloses the first well; and wherein the step of applying a second well voltage to the second well includes the step of applying a second well voltage that is sufficiently large to reduce current flow between the first well and the substrate.

14. A method of erasing a flash EEPROM memory cell having a source region, a drain region, a substrate, and a control gate, wherein the method comprising the steps of:
applying a source voltage to the source region;
applying a control voltage to the control gate, the difference between the control voltage and the source voltage being sufficient to erase the flash EEPROM memory cell; and
applying a back biasing voltage to the substrate, wherein the back biasing voltage is applied in proportion to the band-to-band current that is present during erasure of the flash EEPROM memory cell and includes the steps of:
connecting a resistor in series with the substrate; and
applying the back biasing voltage to the resistor connected in series with the substrate.

15. A method of erasing a flash EEPROM memory cell having a source region, a drain region, a substrate, and a control gate, wherein the method comprising the steps of:
applying a source voltage to the source region;
applying a control voltage to the control gate, the difference between the control voltage and the source voltage being sufficient to erase the flash EEPROM memory cell; and
applying a back biasing voltage to the substrate, wherein the back biasing voltage is applied in proportion to the band-to-band current that is present during erasure of the flash EEPROM memory cell;
enclosing the source region and the drain region in a first well within the substrate;
connecting a resistor in series with the first well, wherein the back biasing voltage is coupled with the resistor;
enclosing the first well in a second well, wherein the second well is within the substrate; and
applying a substrate biasing voltage to the second well, wherein the substrate biasing voltage is sufficiently large to reduce current flow between the first well and the substrate.

16. A method of erasing a flash EEPROM memory cell having a source region, a drain region, a substrate, and a control gate, wherein the method comprising the steps of:
applying a source voltage to the source region;
applying a control voltage to the control gate, the difference between the control voltage and the source voltage being sufficient to erase the flash EEPROM memory cell;
applying a first well voltage to a first well, wherein the first well is located in the substrate and encloses the source region and the drain region;
applying a second well voltage to a second well, wherein the second well is located in the substrate and encloses the first well; and
wherein a modulator is used to modulate the first well voltage during memory cell erasure, said modulator comprises a resistor that is used to modulate the first well voltage during erasure of the flash EEPROM memory cell.

17. The method of claim 16, wherein the modulator forms part of a feedback mechanism that causes at least the first well voltage to be applied in proportion to the band-to-band current that is present during erasure of the flash EEPROM memory cell.

18. A flash EEPROM memory cell comprising:
a substrate;
a source region in the substrate at which a source voltage is applied during erasure of the flash EEPROM memory cell;
a drain region in the substrate;
a first oxide layer on the substrate;
a floating gate on said first oxide layer, wherein said floating gate is disposed above at least a portion of the source region;
a control gate on a second oxide layer, wherein said control gate is disposed above the floating gate, and wherein a control voltage is applied to said control gate during erasure of the flash EEPROM memory cell;
a back biasing connection on the substrate at which a non-zero first biasing voltage is applied during erasure of the flash EEPROM memory cell; and
a resistor associated with the back biasing connection, wherein the resistor is used to modulate the first biasing voltage during memory cell erasure.

19. The flash EEPROM memory cell of claim 18, wherein:
the source voltage is in the range of 0 V to 10 V;
the control voltage is in the range of 0 V to −20 V; and
the first biasing voltage is greater than 0 V and less than or equal to 10 V.

20. A flash EEPROM memory cell comprising:
a substrate;
a source region in the substrate at which a source voltage is applied during erasure of the flash EEPROM memory cell and the source voltage is in the range of 0 V to 10 V;
a drain region in the substrate;
a first oxide layer on the substrate;
a floating gate on said first oxide layer, wherein said floating gate is disposed above at least a portion of the source region;
a control gate on a second oxide layer, wherein said control gate is disposed above the floating gate, and wherein a control voltage is applied to said control gate during erasure of the flash EEPROM memory cell and the control voltage is in the range of 0 V to −20 V;
a back biasing connection on the substrate at which a non-zero first biasing voltage is applied during erasure of the flash EEPROM memory cell and the first biasing voltage is between 0 V and 10 V;
a first well located in the substrate and enclosing the source region and the drain region, wherein the back biasing connection is coupled to the first well;
a substrate biasing connection on the substrate at which a second biasing voltage is applied during erasure of the flash EEPROM memory cell and the second biasing voltage is between 0 V and −10 V; and
a second well located in the substrate and enclosing the first well, wherein the substrate biasing connection is coupled to the second well for reducing current flow into the substrate during erasure of the flash EEPROM memory cell.

21. The flash EEPROM memory cell of claim 20, further comprising a modulator associated with the back biasing connection, wherein the modulator is used to modulate the first biasing voltage during memory cell erasure.

22. The flash EEPROM memory cell of claim 21, wherein the back biasing connection is coupled to the substrate biasing connection, wherein coupling the back biasing connection to the substrate biasing connection causes the second well to be reversed biased relative to the substrate during memory cell erasure.

23. A flash EEPROM memory cell comprising:
a substrate;
a source region in the substrate at which a source voltage is applied during erasure of the flash EEPROM memory cell;
a drain region in the substrate;
a first oxide layer on the substrate;
a floating gate on said first oxide layer, wherein said floating gate is disposed above at least a portion of the source region;
a control gate on a second oxide layer, wherein said control gate is disposed above the floating gate, and wherein a control voltage is applied to said control gate during erasure of the flash EEPROM memory cell;
a back biasing connection on the substrate at which a non-zero first biasing voltage is applied during erasure of the flash EEPROM memory cell;
a first well located in the substrate and enclosing the source region and the drain region, wherein the back biasing connection is coupled to the first well;
a substrate biasing connection on the substrate at which a second biasing voltage is applied during erasure of the flash EEPROM memory cell;
a second well located in the substrate and enclosing the first well, wherein the substrate biasing connection is coupled to the second well for reducing current flow into the substrate during erasure of the flash EEPROM memory cell; and
a modulator associated with the back biasing connection, wherein the modulator is used to modulate the first biasing voltage during memory cell erasure and the modulator used to modulate the first biasing voltage during memory cell erasure is a resistor.

24. A method of erasing a flash EEPROM memory cell having a source region, a drain region, a substrate, and a control gate, wherein the method comprising the steps of:
applying a source voltage to the source region;
applying a control voltage to the control gate, the difference between the control voltage and the source voltage being sufficient to erase the flash EEPROM memory cell; and
applying a back biasing voltage, in a range that is greater than 0 volts and less than or equal 0.5 volts during erasure of the flash EEPROM memory cell, to the substrate, wherein the back biasing voltage is sufficient to reduce band-to-band current between the source region and the substrate.

25. The method of claim 24, further comprising the step of applying the source voltage simultaneously or prior to the application of the back biasing voltage.

26. A method of erasing a flash EEPROM memory cell having a source region, a drain region, a substrate, and a control gate, wherein the method comprising the steps of:
applying a source voltage to the source region;

applying a control voltage to the control gate, the difference between the control voltage and the source voltage being sufficient to erase the flash EEPROM memory cell;

applying a back biasing voltage to the substrate, wherein the back biasing voltage is sufficient to reduce band-to-band current between the source region and the substrate; and associating a resistor with the back biasing voltage, wherein the resistor is used to modulate the back biasing voltage during memory cell erasure.

27. A method of erasing a flash EEPROM memory cell having a source region, a drain region, a substrate, and a control gate, wherein the method comprising the steps of:

applying a source voltage to the source region;

applying a control voltage to the control gate, the difference between the control voltage and the source voltage being sufficient to erase the flash EEPROM memory cell;

applying a back biasing voltage to the substrate, wherein the back biasing voltage is sufficient to reduce band-to-band current between the source region and the substrate;

enclosing the source region and the drain region in a first well within the substrate, wherein the back biasing voltage is coupled to the first well;

enclosing the first well in a second well, wherein the second well is within the substrate;

applying a substrate biasing voltage to the second well, wherein the substrate biasing voltage is sufficiently large to reduce current flow between the first well and the substrate; and applying the back biasing voltage simultaneously or prior to the application of the substrate biasing voltage during memory cell erasure.

* * * * *